United States Patent
Kim et al.

(10) Patent No.: US 6,842,033 B1
(45) Date of Patent: Jan. 11, 2005

(54) METHOD FOR CONTROLLING DELAY TIME OF SIGNAL IN SEMICONDUCTOR DEVICE

(75) Inventors: Ji Hyun Kim, Seoul (KR); Byoung Jin Choi, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/731,608

(22) Filed: Dec. 9, 2003

(30) Foreign Application Priority Data

Jun. 30, 2003 (KR) ................................ 10-2003-0043890

(51) Int. Cl.[7] ................................................ G01R 31/28
(52) U.S. Cl. ................................ 324/765; 324/158.1
(58) Field of Search .......................... 324/765, 769, 324/158.1, 73.1; 365/201; 714/718; 327/161, 252, 263

(56) References Cited

U.S. PATENT DOCUMENTS

| | | | |
|---|---|---|---|
| 4,497,056 A | * | 1/1985 | Sugamori .................... 714/736 |
| 4,929,888 A | * | 5/1990 | Yoshida ...................... 714/736 |
| 5,894,226 A | * | 4/1999 | Koyama ...................... 324/765 |
| 6,158,030 A | * | 12/2000 | Reichle et at. .............. 714/724 |

* cited by examiner

*Primary Examiner*—Ernest Karlsen
(74) *Attorney, Agent, or Firm*—Ladas & Parry LLP

(57) ABSTRACT

A method for controlling a delay time of a signal in a semiconductor device is disclosed, which comprises the steps of: a) applying a test mode pulse signal; b) generating N number of test mode selection signals which are synchronized with the falling edges of the test mode pulse signal to respond sequentially; c) sequentially regenerating the (N−1)th test mode selection signal after the Nth test mode selection signal is generated; and d) repeating step c, wherein an input signal inputted to the semiconductor device is delayed by a predetermined time to be outputted as an output signal only when first to the (N−1)th test mode selection signals are enabled, and the delayed times are different from each other according to the first to the (N−1)th test mode selection signals. In the method, delay degree of a predetermined signal can be freely adjusted in a test mode. Further, a desired delay degree can be set by means of an external signal, regardless of the number of unit delay devices constituting a delay circuit.

13 Claims, 11 Drawing Sheets

METHOD FOR CONTROLLING DELAY TIME OF SIGNAL IN SEMICONDUCTOR DEVICE

BACKGROUND OF THE INVENTION

1. Field of the Invention

The present invention relates to a method for controlling a delay time of a signal in a semiconductor device, which can freely adjust delay degree of a predetermined signal in a test mode, and more particularly to a method for controlling a delay time of a signal in a semiconductor device, which can set a desired delay degree by means of an external signal, regardless of the number of unit delay devices constituting a delay circuit.

2. Description of the Prior Art

In a general delay circuit, unit delay devices are connected in a row in order to make a desired delay time (i.e. delay degree). Further, in a test mode adjusting the delay degree, the number of unit delay devices, through which a signal inputted in the delay circuit passes, is adjusted by means of a predetermined control signal, so that the total delay degree (time) is adjusted. In this case, the variation of the delay is limited to an integral number times of the unit delay device, and a maximum value of the total delay degree is determined as the total number of the unit delay devices. Accordingly, the minimum and maximum delay degrees are restrictive.

Hereinafter, the prior art will be described with reference to the accompanying drawings.

FIG. 1 is a block diagram of a conventional delay control circuit. Herein, an input signal "in" is delayed by a predetermined time to be outputted to an output terminal, and the delay degree is determined by control signals "tmsel<0:4>".

As shown in FIG. 1, the delay control circuit includes a test mode delay section (tm_dly) 100 and a test delay section (tstdly) 120. The test delay section 120 delays the input signal "in" by a predetermined time. The test mode delay section 100 receives test signals "tm_reset and tm_pulse" to output the control signals "tmsel<0:4>" determining the delay degree of the test delay section 120. Herein, a "pwrup" is a power-up signal and represents a driving voltage. An "out" signal represents a signal outputted after the input signal "in" is inputted and delayed for a predetermined time.

FIG. 2 is a block diagram of the test mode delay section 100 shown in FIG. 1.

As shown in FIG. 2, in the case in which the power-up signal "pwrup" is enabled to be at a high level and the test mode reset signal "tm_reset" is enabled to be at a high level, when the test mode pulse signal "tm_pulse" is applied in a pulse shape, the test mode delay section 100 generates predetermined output signals "tmsel<0>, tmsel<1>, tmsel<2>, tmsel<3>, and tmsel<4>". Herein, the signal "tmsel<1>" is a signal in which the signal "tmsel<0>" passes through a shift resistor 200 to be outputted, the signal "tmsel<2>" is a signal in which the signal "tmsel<1>" passes through a shift resistor 220 to be outputted, the signal "tmsel<3>" is a signal in which the signal "tmsel<2>" passes through a shift resistor 240 to be outputted, the signal "tmsel<4>" is a signal in which the signal "tmsel<3>" passes through a shift resistor 260 to be outputted.

Herein, waveforms of signals in the circuit shown in FIG. 2 are shown in FIG. 7.

As shown in FIG. 7, when the power-up signal "pwrup" is applied to a high state and the test mode pulse signal tm_pulse is toggled in a pulse shape, the output signals "tmsel<0>, tmsel<1>, tmsel<2>, tmsel<3>, and tmsel<4>" show waveforms as shown in FIG. 7.

That is, as shown in FIG. 2 and FIG. 7, the output signal "tmsel<0>" is synchronized with a falling edge of the test mode pulse signal tm_pulse to shift from a high state to a low state. The output signal "tmsel<1>" is synchronized with a falling edge of the output signal "tmsel<0>" to shift from a low state to a high state, and is synchronized with a falling edge of the test mode pulse signal tm_pulse to re-shift to a low state. The output signal "tmsel<2>" is synchronized with a falling edge of the output signal "tmsel<1>" to shift from a low state to a high state, and is synchronized with a falling edge of the test mode pulse signal "tm_pulse" to re-shift to a low state. The output signal "tmsel<3>" is synchronized with a falling edge of the output signal "tmsel<2>" to shift from a low state to a high state, and is synchronized with a falling edge of the test mode pulse signal "tm_pulse" to re-shift to a low state. The output signal "tmsel<4>" is synchronized with a falling edge of the output signal "tmsel<3>" to shift from a low state to a high state, and is synchronized with a falling edge of the test mode pulse signal "tm_pulse" to re-shift to a low state. Next, the output signal "tmsel<0>" is synchronized with a falling edge of the output signal "tmsel<4>" to shift from a low state to a high state, and is synchronized with a falling edge of the test mode pulse signal "tm_pulse" to re-shift to a low state. The operation continuously repeats when the test mode pulse signal "tm_pulse" is continuously applied.

FIG. 3 is a block diagram of the test delay section 120 shown in FIG. 1. In a test mode, the test delay section 120 delays an input signal by a predetermined time and outputs the delayed signal to an output terminal "out" in response to the control signals "tmsel<0:4>".

As shown in FIG. 3, the input signal "in" of the test delay section 120 is applied to the first delay section 300 from among delay sections 300, 320, 340, and 360 connected in series with each other, and is sequentially delayed. Further, a transmission gate 302 is connected to an input terminal of the delay section 300. A transmission gate 322 is connected to an output terminal of the delay section 300 and an input terminal of the delay section 320. A transmission gate 342 is connected to an output terminal of the delay section 320 and an input terminal of the delay section 340. A transmission gate 362 is connected to an output terminal of the delay section 340 and an input terminal of the delay section 360. A transmission gate 382 is connected to an output terminal of the delay section 360. The transmission gates 302, 322, 342, 362, and 382 are respectively turned on/off by signals "tmsel<2>, tmsel<1>, tmsel<0>, tmsel<3>, and tmsel<4>". Accordingly, when one of the transmission gates is turned on by the signals "tmsel<2>, tmsel<1>, tmsel<0>, tmsel<3>, and tmsel<4>", the input signal "in" is delayed by a predetermined time and then outputted.

As shown in FIG. 3, in the prior art, the maximum delay time of the input signal "in" has a predetermined limitation. That is, the prior art has a problem in that the maximum delay time of the input signal is inevitably determined depending on a total number of the delay devices.

SUMMARY OF THE INVENTION

Accordingly, the present invention has been made to solve the above-mentioned problems occurring in the prior art, and an object of the present invention is to provide a delay control circuit used in a semiconductor device, which enables a control signal determining a predetermined delay time to variously adjust the delay degree in synchronization with a time point in which an external control signal is applied, in addition to the existing function of just selecting one from among delay paths existed in a test delay section.

In order to achieve the above objects, according to one aspect of the present invention, there is provided an apparatus for controlling a delay time of a signal in a semiconductor device comprising: a test mode delay section for receiving a pulse signal and outputting first to (N+1)th control signals; and a test delay section for delaying an input signal for a predetermined time by the first to the (N+1)th control signals and outputting the delayed signal, wherein a delay time required for outputting the input signal as an output signal is controlled according to an enabled control signal from among the first to the (N+1)th control signals, the first to the (N+1)th control signals are sequentially enabled by the pulse signal, and, after the (N−1)th control signal is enabled, the Nth and the (N+1)th control signals are alternately enabled every time the pulse signal is toggled.

In the apparatus, enabling points of the Nth and (N+1)th control signals can be adjusted by adjusting an enabling point of the pulse signal.

In the apparatus, in a standby state, the first control signal is in an enabled state, and the second to the (N+1)th control signals are in a disabled state.

In the apparatus, the test mode delay section further receives a reset signal, the first control signal is enabled and the second to the (N+1)th control signals are disabled when the reset signal is enabled.

In the apparatus, the test delay section includes first to Nth delay devices sequentially connected to each other and first to Nth switch devices, the Nth switch device is connected between an output terminal of the first delay device and a first node, the first to the (N−1)th delay devices are respectively connected between each output terminal of the second to the Nth delay devices and first node, the input signal is received at an input terminal of the first delay device, and each of the first to the Nth switch devices is turned on/off in response to the first to the Nth control signals.

In the apparatus, the test mode delay section includes first to Nth shift units, the first control signal is outputted from an input terminal of the first shift unit, the second to the (N+1)th control signals are respectively outputted from each output terminal of the first to the Nth shift units, and the (N+1)th control signal is applied to an input terminal of the (N−1)th shift unit through a latch means, in order to allow the Nth control signal and the (N+1)th control signal to be alternately enabled, every time the pulse signal is toggled after the (N−1)th control signal is enabled.

In order to achieve the above objects, according to one aspect of the present invention, there is provided a method for controlling a delay time of a signal in a semiconductor device comprising the steps of: a) applying a test mode pulse signal; b) generating N number of test mode selection signals which are synchronized with the falling edges of the test mode pulse signal to respond sequentially; c) sequentially regenerating the (N−1)th test mode selection signal after the Nth test mode selection signal is generated; and d) repeating step c, wherein an input signal inputted to the semiconductor device is delayed by a predetermined time to be outputted as an output signal only when first to the (N−1)th test mode selection signals are enabled, and the delayed times are different from each other according to the first to the (N−1)th test mode selection signals.

In the method, a falling point of the test mode pulse signal is adjusted, so as to adjust pulse widths of the Nth and the (N−1)th test mode selection signals, thereby adjusting the delayed time required for outputting the input signal as the output signal.

In the method, step b includes the substeps of: b-1) shifting the first test mode selection signal, which maintains a standby state of a high level, to a lower level and a second test mode selection signal to a high level when a first falling edge of the test mode pulse signal occurs, b-2) shifting the second test mode selection signal at a high level to a lower level and a third test mode selection signal to a high level when a second falling edge of the test mode pulse signal occurs, b-3) shifting the third test mode selection signal at a high level to a lower level and a fourth test mode selection signal to a high level when a third falling edge of the test mode pulse signal occurs, b-4) b-2) and b-3) are employed in the fifth to the Nth test mode selection signal.

In the method, each of high level pulse widths of the second to the (N−1)th test mode selection signals is the same as a period of the test mode pulse signal generating the second to the (N−1)th test mode selection signals.

The preferred embodiments will now be described below in detail in reference to the accompanying drawings.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 4:
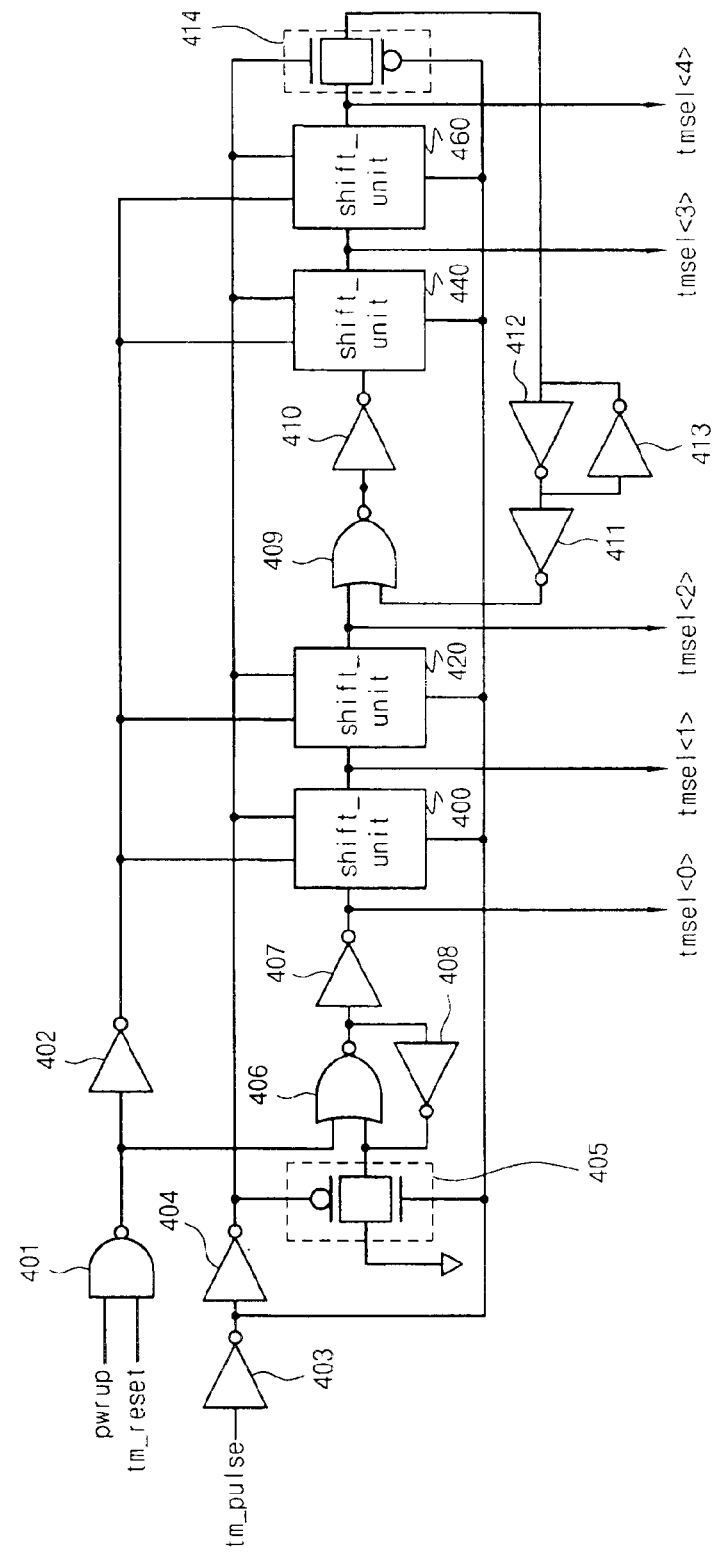
FIG. 4 is a block diagram of a test mode delay section according to the present invention.
Figure 5:
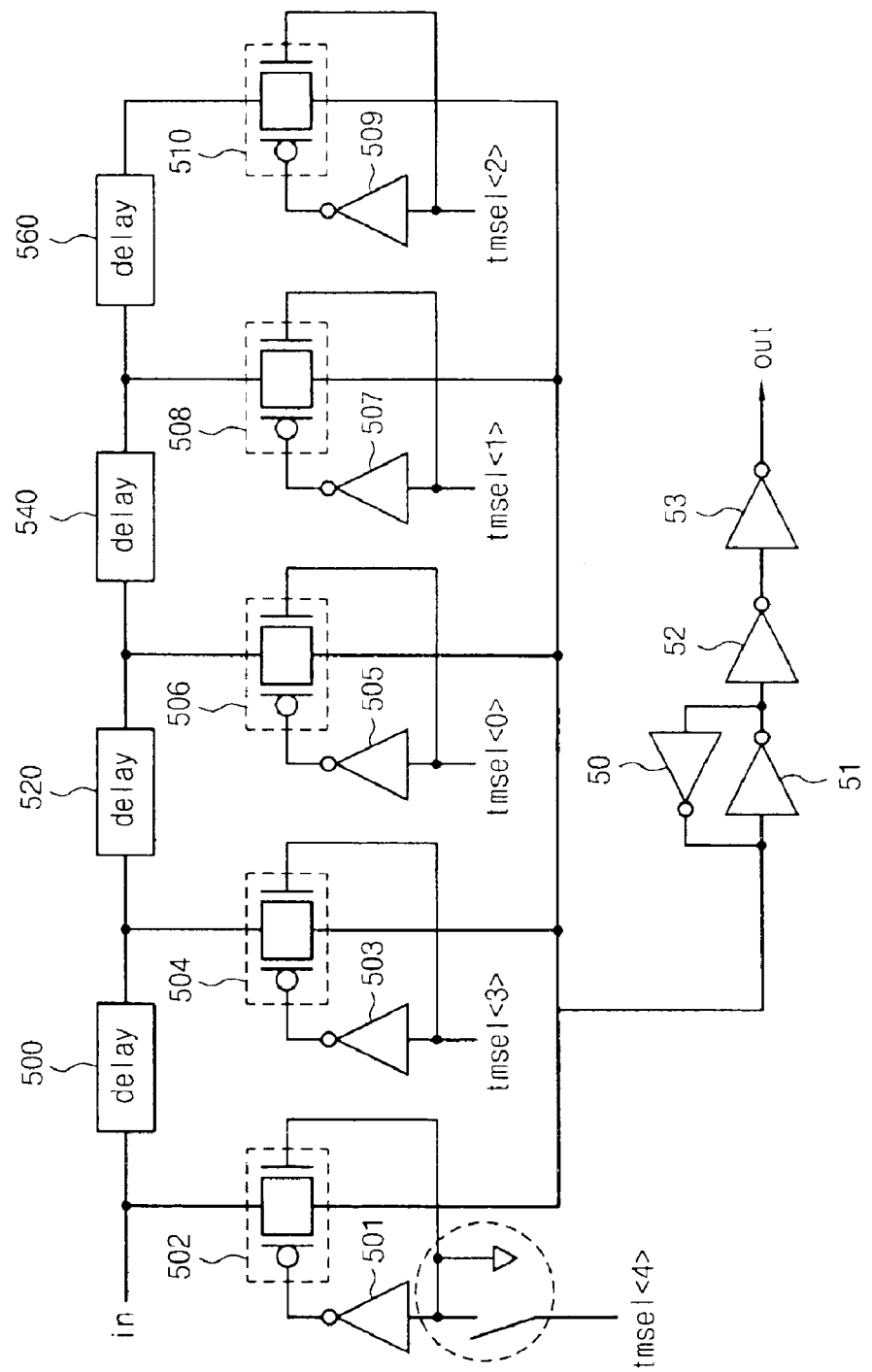
FIG. 5 is a block diagram of a test delay section according to the present invention.

FIG. 4 is a block diagram of a test mode delay section according to the present invention, and FIG. 5 is a block diagram of a test delay section according to the present invention. The test mode delay section generates a control signal controlling a delay time, and the test delay section is a circuit delaying an input signal by a predetermined time.

Figure 2:
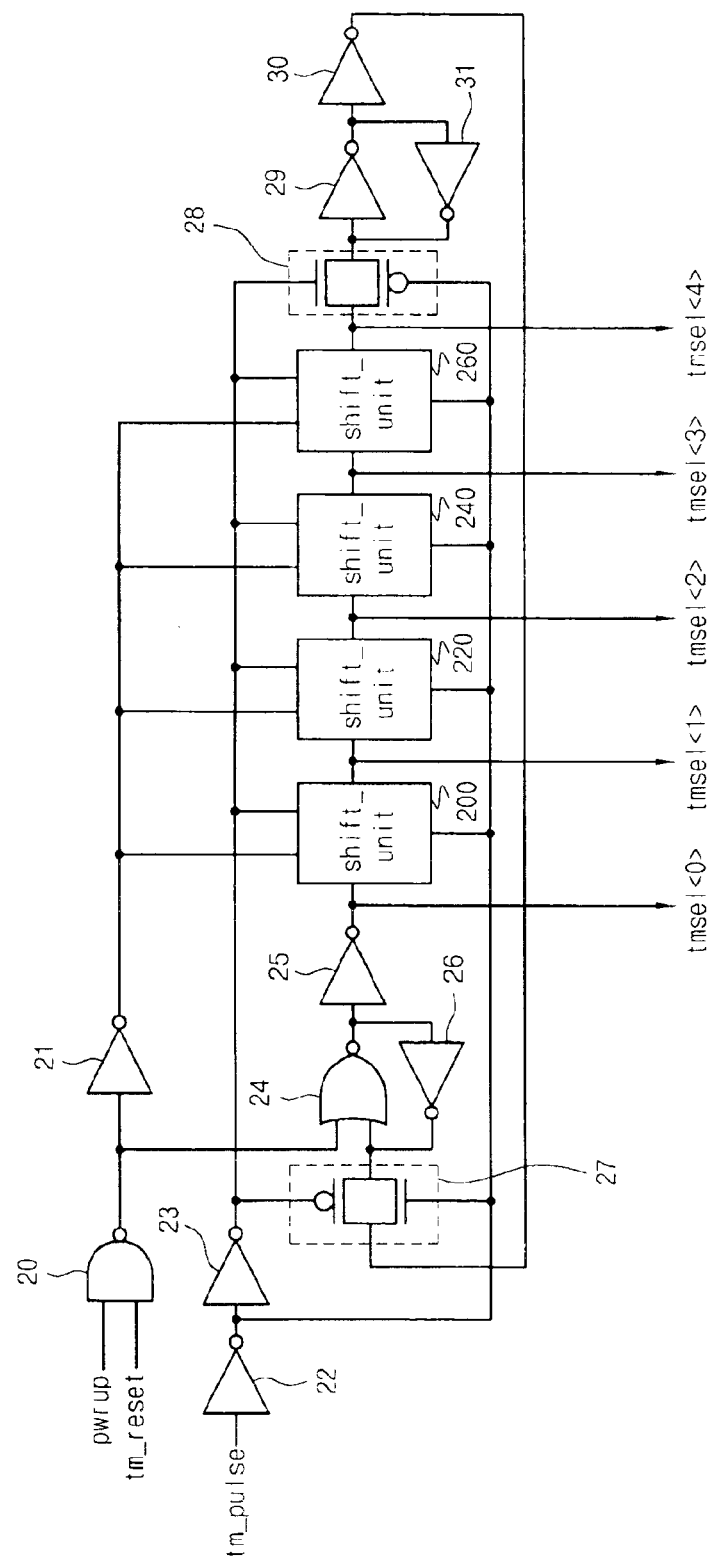
FIG. 2 is a block diagram of the test mode delay section shown in FIG. 1.
Figure 3:
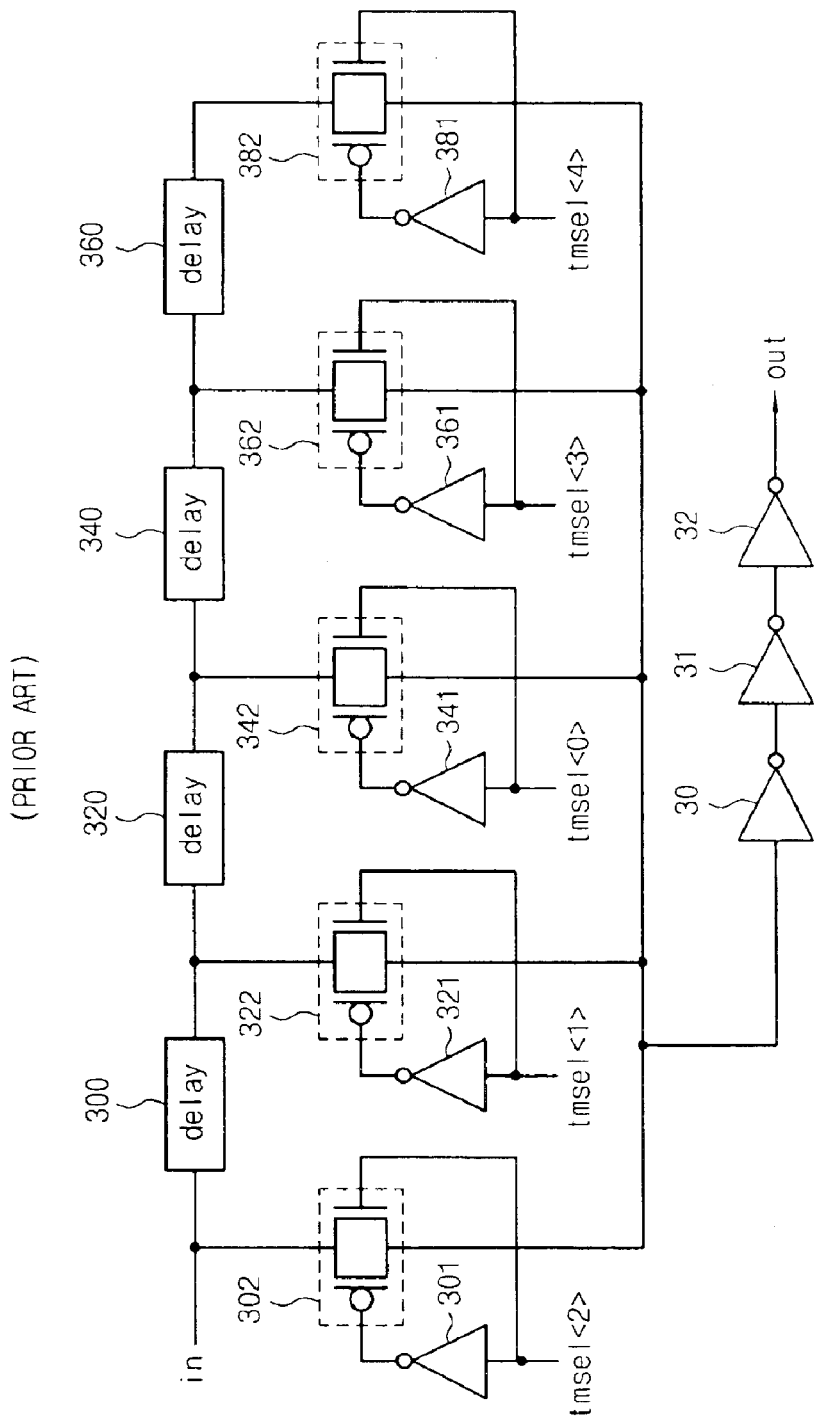
FIG. 3 is a block diagram of the test delay section shown in FIG. 1.

Output signals "tmsel<0>, tmsel<1>, tmsel<2>, tmsel<3>, and tmsel<4>" in FIG. 4 are applied to a circuit in FIG. 5 to determine a delay time required for outputting an input signal "in" applied to the circuit in FIG. 5. For convenience of description, the test mode delay section shown in FIG. 4 will be first described. For reference, a basic waveform and an operation of signals "pwrup, tm_reset, tm_pulse" used in FIG. 4 are the same as those in FIG. 2.

Figure 8:
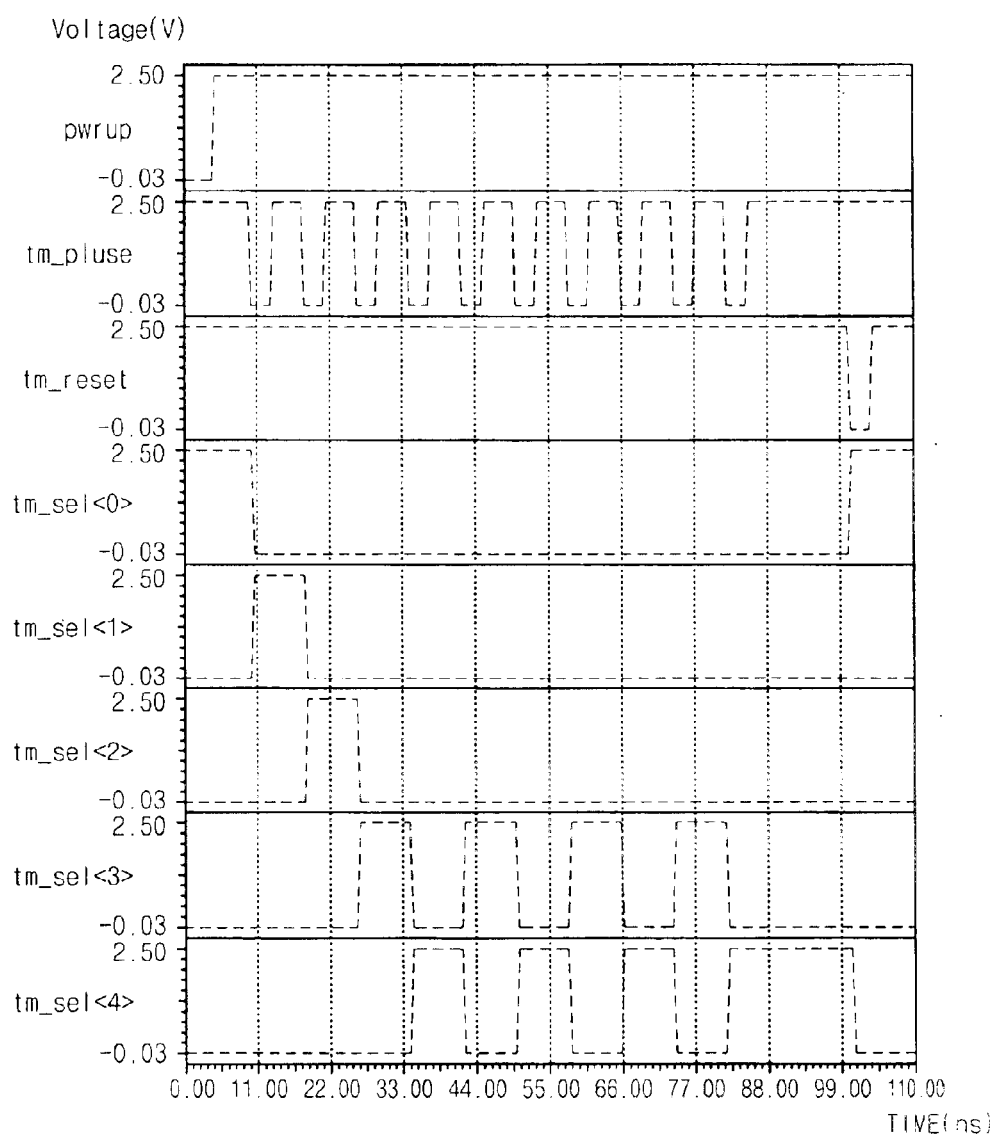
FIG. 8 is a waveform view illustrating a simulation result of signals used in the test mode delay section shown in FIG. 4 according to the present invention.

Herein, an operation of a circuit shown in FIG. 4 will be easily understood with reference to FIG. 8 showing a simulation result of signals used in the test mode delay section shown in FIG. 4.

In FIG. 4, the signal "pwrup" is a signal for setting an initial value of the circuit, initially has a low value, and then maintains a high value when the circuit operates.

The signal "tm_reset" is a signal for resetting the circuit, maintains a high value in a standby state, and resets the circuit in FIG. 4 when the signal "tm_reset" shifts to a low state. In the reset state; the signal "tmsel<0>" has a high value, and the signals "tmsel<1> to tmsel<4>" have a low value.

In an initial operation, the signal "pwrup" and the signal "tm_reset" are a high level state. A NAND gate 401 receives the signal "pwrup" and the signal "tm_reset", and an output signal of the NAND gate 401 is applied to an inverter 402. Accordingly, an output level of the inverter 402 is a high level, and shift units 400, 420, 440, and 460 come into an active mode.

The signal "tm_pulse" is a pulse signal having a high value and a low value alternately. An inverter 403 receives the signal "tm_pulse", and an inverter 404 receives an output signal of the inverter 403. When the signal "tm_pulse" has a low level, a switch 405 is turned on to transmit a low level to a NOR gate 406. Since the output signal of the NAND gate 401 is a low level, an output signal of the NOR gate 406 is a high level. When an initial signal "pwrup" is a low level, the signal "tmsel<0>" maintains a high level. Accordingly, an output signal (i.e. tmsel<0>) of an inverter 407, which receives the output signal of the NOR gate 406, is shifted from a high level to a low level.

As described above, the signal "tm_pulse" is a pulse signal. Accordingly, every time the signal "tm_pulse" shifts to a low value, the initial high value of the signal "tmsel<0>" is transmitted to the signals "tmsel<1> to tmsel<4>" by turns through the shift units 400, 420, 440, and 460. Herein, in the case of FIG. 2, a value is transmitted from the signal "tmsel<4>" to the signal "tmsel<0>" (see FIG. 7). However, in the case of FIG. 4, the value of the signal "tmsel<4>" is again transmitted to the signal "tmsel<3>", and only two signals "tmsel<3> and tmsel<4>" alternate (see FIG. 8). That is, in FIG. 4, the signal "tmsel<4>" passing through the shift unit 460 is inputted to a NOR gate 409 through latches 412 and 413 and an inverter 411. Herein, since the output signal "tmsel<2>" of the shift unit 420 is a low level, a signal outputted to an inverter 410 is the signal "tmsel<4>". Accordingly, every time the signal "tm_pulse" is toggled, only two signals "tmsel<3> and tmsel<4>" can alternately move.

In an operation shown in FIG. 4, when the signal "pwrup" is in a low state and the signal "tm_reset" is in a high state initially, the signal "tmsel<0>" is a high level as described above.

Next, even though the signal "pwrup" shifts to a high level, the signal "tmsel<0>" maintains the high level by latches 406 and 408.

For reference, in a standby state, the values of the signal "tm_reset" and the signal "tm_pulse" are high, the values of the "tmsel<1> to tmsel<4>" are low.

Next, when the signal "tm_pulse" at the high level shifts to a low level, a transmission gate 405 is turned on, and a low value is transmitted to the NOR gate 406. Herein, since the output signal of the NAND gate 401 is a low level, a value of the signal "tmsel<0>" at the high state shifts to a low level. Simultaneously, a value of the signal "tmsel<1>" changes from a low to a high by the shift unit 400.

Next, when the signal "tm_pulse" shifts from a high level to a low level, the signal "tmsel<1>" comes into a low level and the signal "tmsel<2>" has a high value.

Every time the signal "tm_pulse" is toggled, a logic level value of the signal "tmsel<0>" is transmitted to the signals "tmsel<1> to tmsel<4>" by turns.

Herein, a high value, which has been transmitted to the the signal "tmsel<4>" at the fourth falling edge of the signal "tm_pulse", is not transmitted to the signal "tmsel<0>", but transmitted to the signal "tmsel<3>" at the fifth falling edge of the signal "tm_pulse". That is, the signal "tmsel<4>" is transmitted to the signal "tmsel<3>" through the latches 412 and 413, the inverter 411, the NOR gate 409, and the inverter 410.

Afterward, while the signal "tm_pulse" is toggled, the signals "tmsel<3> and tmsel<4>" have a high level and a low level by turns (see FIG. 8).

Signals "tmsel<0:4>" generated by this method is applied to an input terminal of the test delay section shown in FIG. 5. As described above, the signals "tmsel<0:4>" are signals controlling a delay time of an input signal "in". Since the signal "tmsel<0>" has been initially determined as a high level, the delay degree can be adjusted depending on a signal "tmsel" selected by applying a signal "tm_pulse".

In a construction, the input signal "in" is applied to a delay device 500, and delay devices 500, 520, 540, and 560 have a predetermined delay time.

An output terminal of the delay device 500 is connected to an input terminal of the delay device 520. Further, an output terminal of the delay device 540 is connected to an input terminal of the delay device 560.

An operation of a transmission gate 502 is controlled by the signal "tmsel<4>", an operation of a transmission gate 504 is controlled by the signal "tmsel<3>", an operation of a transmission gate 506 is controlled by the signal "tmsel<0>", an operation of a transmission gate 508 is controlled by the signal "tmsel<1>", and an operation of a transmission gate 510 is controlled by the signal "tmsel<2>".

In a basic operation, the input signal "in" is outputted through a selected transmission gate, latches 50 and 51, and buffers 52 and 53. Further, a delay time from an input to an output is determined according to a selected transmission gate.

Hereinafter, the operation will be described in more detail.

When the transmission gate 506 is turned on by the control signal "tmsel<0>", the input signal "in" is outputted through the delay device 500 and 520, the transmission gate 506, the latches 50 and 51, and the buffers 52 and 53.

When the transmission gate 508 is turned on by the control signal "tmsel>", the input signal "in" is outputted through the delay device 500, 520, and 540, the transmission gate 508, the latches 50 and 51, and the buffers 52 and 53.

When the transmission gate 510 is turned on by the control signal "tmsel<2>", the input signal "in" is outputted through the delay device 500, 520, 540, and 560, the transmission gate 510, the latches 50 and 51, and the buffers 52 and 53.

When the transmission gate 504 is turned on by the control signal "tmsel<3>", the input signal "in" is outputted through the delay device 500, the transmission gate 504, the latches 50 and 51, and the buffers 52 and 53.

Herein, differently from the conventional circuit, the signal "tmsel<4>" is not connected to the transmission gate 502. Accordingly, when the signals "tmsel<1> to tmsel<3>" are enabled, delay paths are formed. However, when the signal "tmsel<4>" is selected, an output signal "out" maintains the existing value. As described above, when the signal "tm_pulse" in FIG. 4 is toggled, the signals "tmsel<3>" and "tmsel<4>" are alternately enabled. Accordingly, when the next signal "tm_pulse" is applied, the signal "tmsel<3>" comes into a high level to turn on the transmission gate 504. Further, the input signal "in" is outputted via the delay device 500, the transmission gate 504, the latches 50 and 51, and the buffers 52 and 53.

As a result, an interval, between the signal "tm_pulse" which causes the signal "tmsel<4>" to be a high level and the signal "tm_pulse" which causes the signal "tmsel<3>" to be a high level again, corresponds to delay degree. Therefore, according to the present invention, the total amount of delay can be adjusted regardless of the number of the delay devices.

Figure 1:
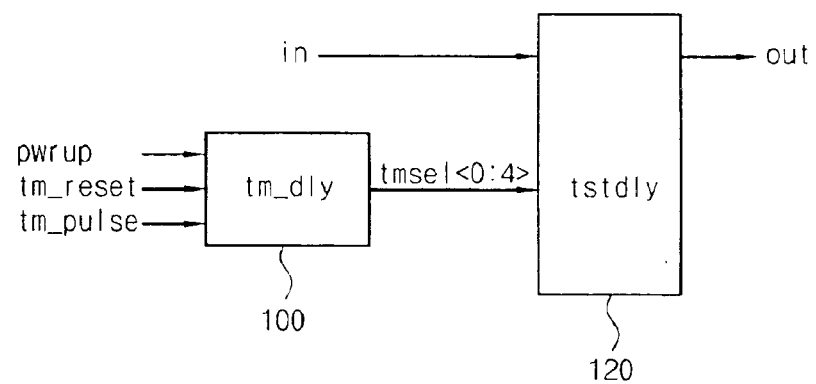
FIG. 1 is a block diagram of a conventional delay control circuit.
Figure 6:
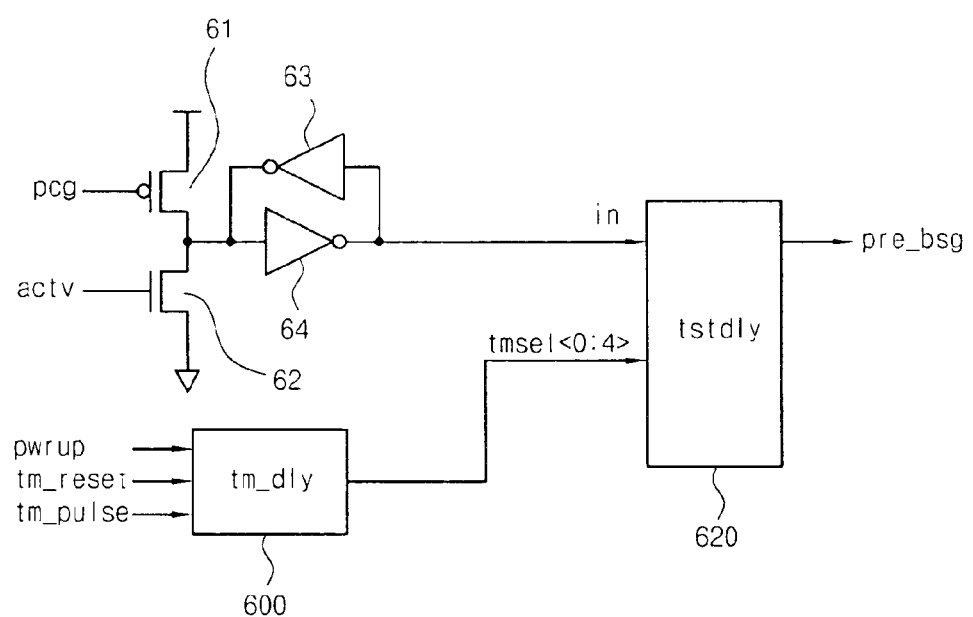
FIG. 6 is a block diagram of a delay control circuit used in a semiconductor memory device.

FIG. 6 is a block diagram of a delay control circuit used in a semiconductor memory device, and the circuit has the same function as that of the circuit in FIG. 1.

As shown in FIG. 6, the delay control circuit includes a test mode delay section (tm_dly) 600 and a test delay section (tstdly) 620.

The test delay section 620 delays an input signal "in" by a predetermined time, and the test mode delay section 600 receives test signals "tm_reset and tm_pulse" to output signals "tmsel<0:4>" determining the delay degree of the test delay section 620.

Herein, a signal "pwrup" is a power-up signal which represents a driving voltage. Further, a signal "pre_bsg" is a signal in which the input signal. "in" is delayed by a predetermined time and then outputted, and it is the same signal as the signal "out" in the prior art.

As shown in FIG. 6, a PMOS transistor 61 and a NMOS transistor 62 are connected in series between a supply voltage and a ground voltage. Further, a signal "peg" is applied to a gate terminal of the PMOS transistor 61, and a signal "actv" is applied to a gate terminal of the NMOS transistor 62. Latches 63 and 64 are connected to an output terminal of the PMOS transistor 61 and the NMOS transistor 62. An output signal of the latches 63 and 64 is an input signal "in" of the test delay section 620.

Figure 7:
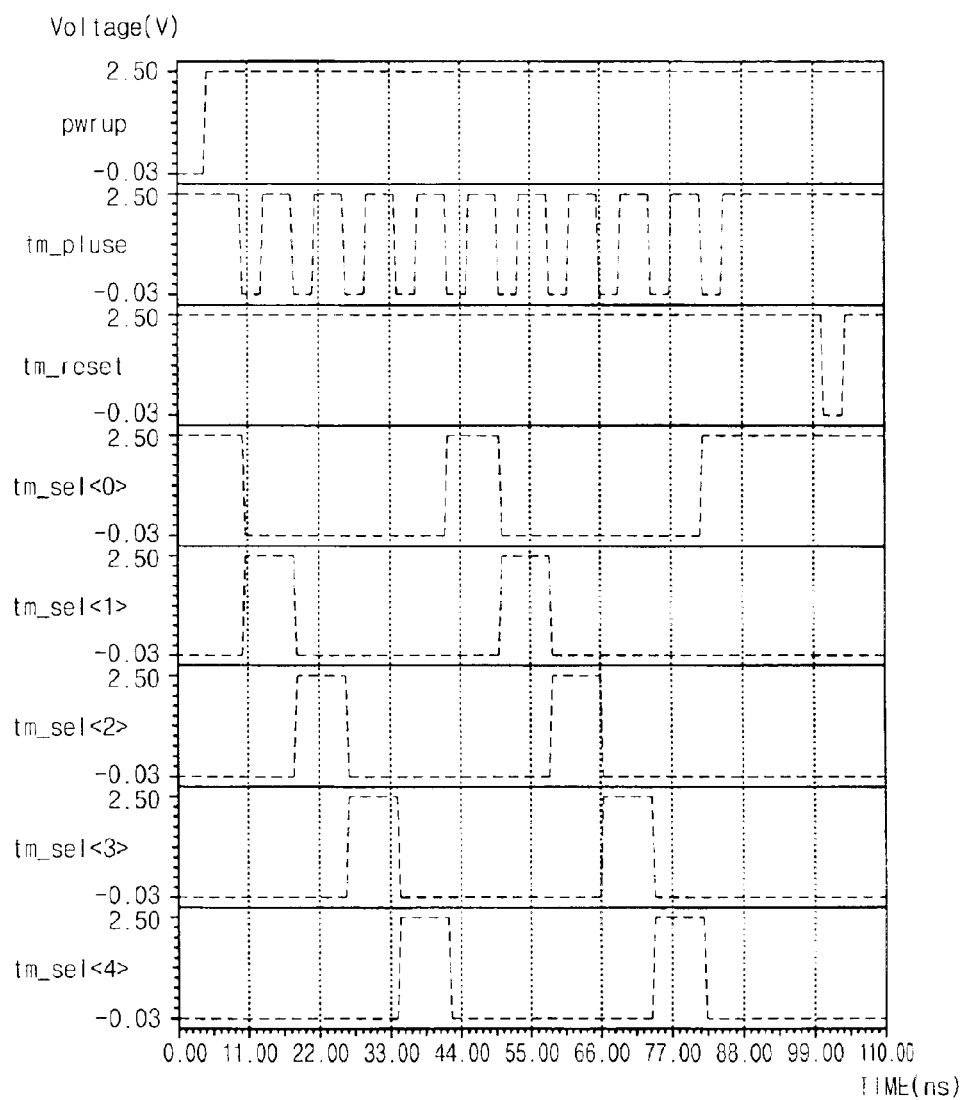
FIG. 7 is a waveform view illustrating a simulation result of signals used in the delay control circuit utilized in a semiconductor memory device shown in FIG. 1.

FIG. 7 is a waveform view illustrating a simulation result of signals used in the delay control circuit utilized in a semiconductor memory device shown in FIG. 1. As described in the prior art, in the case of FIG. 7, in response to the signal tm_pulse, the signals "tmsel<0> to tmsel<4>" sequentially repeats in an order of "tmsel<0>", "tmsel<1>", "tmsel<2>", "tmsel<3>", "tmsel<4>", "tmsel<0>", and "tmsel<1>". Thus, according to the prior art, only one delay time can be obtained from predetermined delay times.

FIG. 8 is a waveform view illustrating a simulation result of signals used in the test mode delay section shown in FIG. 4 according to the present invention.

As shown in FIG. 8, a high value, which has been transmitted to the signal "tmsel<4>" at the fourth falling edge of the signal "tm_pulse", is not transmitted to a signal "tmsel<0>", but transmitted to the signal "tmsel<3>" at the fifth falling edge of the signal "tm_pulse". Accordingly, while the signal "tm_pulse" is toggled, the signals "tmsel<3> and tmsel<4>" have high values by turns. As already described in FIG. 5, since the signal "tmsel<4>" is always in a turned off state, when the signals "tmsel<3> and tmsel<4>" generated as above are used, a delay time from an input signal "in" to an output signal "out" can be randomly determined.

Figure 9:
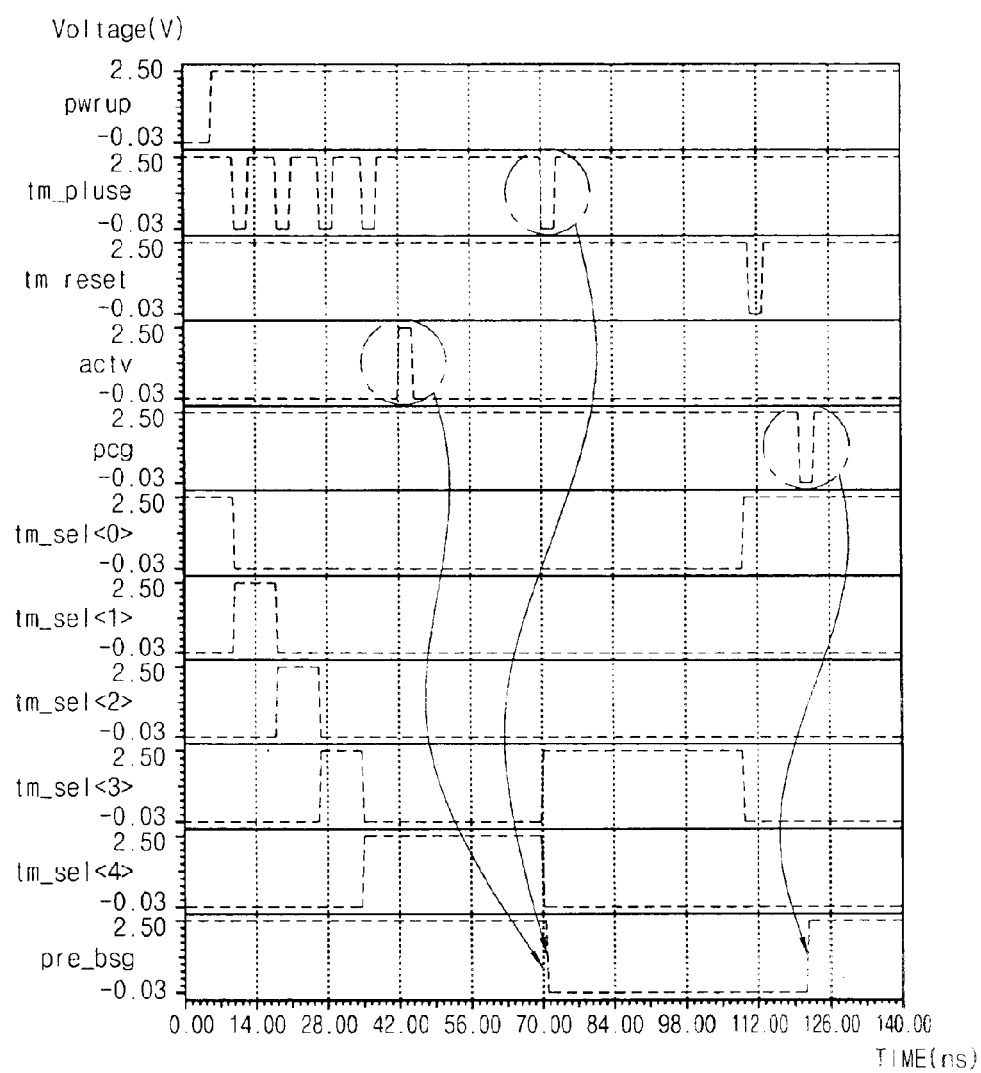
FIG. 9 is a waveform view illustrating a simulation result of signals related to FIGS. 4 to 6.

FIG. 9 is a waveform view illustrating a simulation result of signals related to FIGS. 4 to 6.

As shown in FIG. 9, the signal "pre_bsg", which is an output signal in FIG. 6, maintains a high level in a standby state. That is, in the standby state, the signal "peg" maintains a high level. Accordingly, as shown in FIG. 6, the input signal "in" is a low level, and the output signal "pre_bsg", which is delayed by a predetermined time and outputted, is a high level (see FIGS. 5 and 6). When the signal "actv" is enabled to be at a high level, the input signal "in" is a low level. Accordingly, when the signal "tm_pulse" shifts to a low level, an output signal "out" comes into a low level, which is outputted through a transmission gate turned on by the control signal "tmsel" shifted to a high level. That is, when a predetermined time passes after the input signal is changed by the signal "actv", the output signal "out" is outputted.

Hereinafter, more detailed description will be provided.

In a case in which the signal "tm_pulse" is toggled four times to enable the signal "tmsel<4>" to be selected as a high level, when the signal "actv" is enabled to be at a high level, the input signal "in" has a high level. As shown in FIG. 9, while the signal "tm_pulse" does not shift to a low level, the signal "tmsel<4>" continuously maintains a high level [for reference, the signal "tmsel<4>" at a high level does not enable the transmission gate (reference numeral 502 in FIG. 5) to be turned on, so that an input signal is not transmitted to an output terminal].

When the signal "tm_pulse" shifts to a low level again, the signal "tmsel<3>" comes into a high level. Accordingly, when the signal "tmsel<3>" comes into a high level, the input signal "in" at a high level is transmitted to an output terminal "out" to shift the signal "pre_bsg" to a low level. Afterward, when the signal "tm_reset" shifts to a low level, the test delay section is reset. Accordingly, the signal "tmsel<0>" shifts to a high level and the other control signals "tmsel<1:3>" shift to a low level. In this state, when the signal "peg" is applied, the signal "pre_bsg" returns to a standby state.

Figure 10A:
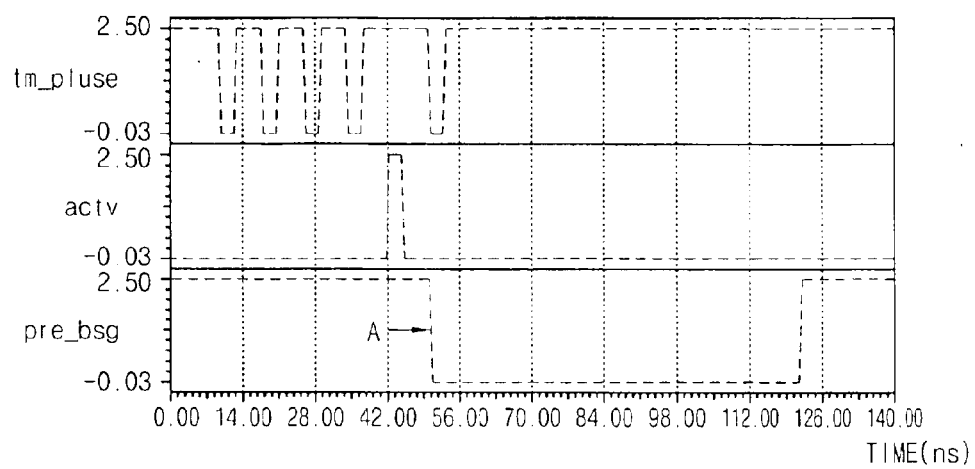
FIGS. 10a to 10c are waveform views according to the present invention.
Figure 10B:
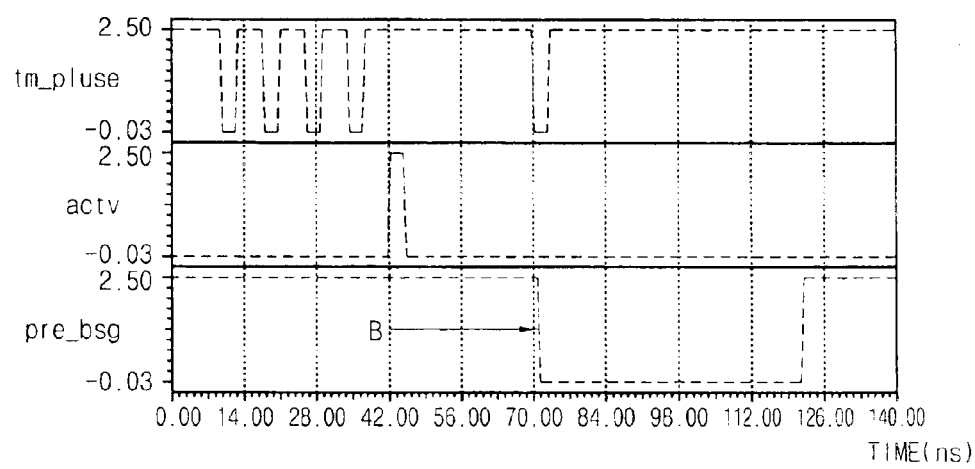
Figure 10C:
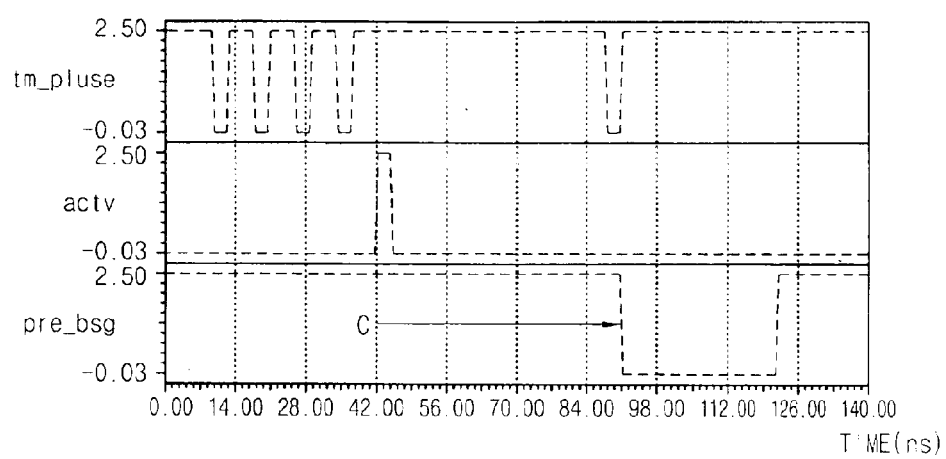

FIGS. 10a to 10c are waveform views illustrating a simulation result showing variation of a delay according to an operation of the signal "tm_pulse", when the test mode delay section and the test delay section according to the present invention are employed. Signals not shown in FIGS. 10a to 10c are basically equal to the signals in FIG. 9. As shown in FIGS. 10a to 10c, after an input signal is changed by the signal "actv", delay time can be adjusted by intervals of the signal "tm_pulse".

As shown in FIGS. 10a to 10c, after the signal "tmsel<4>" is selected as a high level by toggling the signal "tm_pulse" four times, a delay time required for transforming an input signal to an output signal can be adjusted by adjusting a time required for re-shifting the signal "tm_pulse" to a low level. That is, when the signal "actv" is enabled to be at a high level in match with the same timing, the input signal "in" is delayed by a predetermined time and outputted as an the output signal "pre-bsg" having a phase opposite to the input signal "in". Herein, FIGS. 10a to 10c respectively show the delay skews according to intervals between the fourth pulse of the signal "tm_pulse" and the fifth pulse of the signal "tm_pulse". That is, the delay time can be freely adjusted.

As described above, the present invention relates to a method which can randomly adjust the delay degree of the delay time in a test mode, in order to set a predetermined delay time in a certain signal, and the method can be employed in all circuits requiring a delay test operation.

Further, in a method for controlling a delay time of a signal in a semiconductor device according to the present invention, since a predetermined delay can be provided by a predetermined signal in a test mode, size of a circuit for a delay necessary for a test can be reduced. Further, since the method is not limited to the variation of the delay, time and cost, which is necessary for a delay tuning to obtain a necessary delay, can be reduced.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. An apparatus for controlling a delay time of a signal in a semiconductor device, the apparatus comprising:
   a test mode delay section for receiving a pulse signal and outputting first to (N+1)th control signals; and
   a test delay section for delaying an input signal for a predetermined time by the first to the (N+1)th control signals and outputting the delayed signal,
   wherein a delay time required for outputting the input signal as an output signal is controlled according to an enabled control signal from among the first to the (N+1)th control signals, the first to the (N+1)th control signals are sequentially enabled by the pulse signal, and, after the (N−1)th control signal is enabled, the Nth and the (N+1)th control signals are alternately enabled every time the pulse signal is toggled.

2. The apparatus for controlling a delay time of a signal in a semiconductor device as claimed in claim 1, wherein enabling points of the Nth and (N+1)th control signals are adjusted by adjusting an enabling point of the pulse signal.

3. The apparatus for controlling a delay time of a signal in a semiconductor device as claimed in claim 1, wherein, in a standby state, the first control signal is in an enabled state, and the second to the (N+1)th control signals are in a disabled state.

4. The apparatus for controlling a delay time of a signal in a semiconductor device as claimed in claim 1, wherein the test mode delay section further receives a reset signal, the first control signal is enabled and the second to the (N+1)th control signals are disabled when the reset signal is enabled.

5. The apparatus for controlling a delay time of a signal in a semiconductor device as claimed in claim 1, wherein the test delay section includes first to Nth delay devices sequentially connected to each other and first to Nth switch devices, the Nth switch device is connected between an output terminal of the first delay device and a first node, the first to the (N−1)th delay devices are respectively connected between each output terminal of the second to the Nth delay devices and first node, the input signal is received at an input terminal of the first delay device, and each of the first to the Nth switch devices is turned on/off in response to the first to the Nth control signals.

6. The apparatus for controlling a delay time of a signal in a semiconductor device as claimed in claim 5, wherein the (N+1)th control signal is received by the (N+1)th switch device connected between the input terminal of the first delay device and the first node, and the (N+1)th switch device is always in a turned-off state.

7. The apparatus for controlling a delay time of a signal in a semiconductor device as claimed in claim 1, wherein the test mode delay section includes first to Nth shift units, the first control signal is outputted from an input terminal of the first shift unit, the second to the (N+1)th control signals are respectively outputted from each output terminal of the first to the Nth shift units, and the (N+1)th control signal is applied to an input terminal of the (N−1)th shift unit through a latch means, in order to allow the Nth control signal and the (N+1)th control signal to be alternately enabled, every time the pulse signal is toggled after the (N−1)th control signal is enabled.

8. The apparatus for controlling a delay time of a signal in a semiconductor device as claimed in claim 7, wherein, in a standby state, the first control signal is in an enabled state, and the second to the (N+1)th control signal are in a disabled state.

9. The apparatus for controlling a delay time of a signal in a semiconductor device as claimed in claim 8, wherein a logic level stored in an each shift unit is sequentially transmitted to next shift unit every time the pulse signal is toggled.

10. A method for controlling a delay time of a signal in a semiconductor device, the method comprising the steps of:
    a) applying a test mode pulse signal;
    b) generating N number of test mode selection signals which are synchronized with the falling edges of the test mode pulse signal to respond sequentially;
    c) sequentially regenerating the (N−1)th test mode selection signal after the Nth test mode selection signal is generated; and
    d) repeating step c, wherein an input signal inputted to the semiconductor device is delayed by a predetermined time to be outputted as an output signal only when first to the (N−1)th test mode selection signals are enabled, and the delayed times are different from each other according to the first to the (N−1)th test mode selection signals.

11. A method for controlling a delay time of a signal in a semiconductor device as claimed in claim 10, wherein a falling point of the test mode pulse signal is adjusted, so as to adjust pulse widths of the Nth and the (N−1)th test mode selection signals, thereby adjusting the delayed time required for outputting the input signal as the output signal.

12. A method for controlling a delay time of a signal in a semiconductor device as claimed in claim 10, wherein step b includes the substeps of:
    b-1) shifting the first test mode selection signal, which maintains a standby state of a high level, to a lower level and a second test mode selection signal to a high level when a first falling edge of the test mode pulse signal occurs,
    b-2) shifting the second test mode selection signal at a high level to a lower level and a third test mode selection signal to a high level when a second falling edge of the test mode pulse signal occurs,
    b-3) shifting the third test mode selection signal at a high level to a lower level and a fourth test mode selection signal to a high level when a third falling edge of the test mode pulse signal occurs,
    b-4) b-2) and b-3) are employed in the fifth to the Nth test mode selection signal.

13. A method for controlling a delay time of a signal in a semiconductor device as claimed in claim 12, wherein each of high level pulse widths of the second to the (N−1)th test mode selection signals is the same as a period of the test mode pulse signal generating the second to the (N−1)th test mode selection signals.

* * * * *